United States Patent [19]

Piot

[11] Patent Number: 4,908,771
[45] Date of Patent: Mar. 13, 1990

[54] METHOD OF, AND APPARATUS FOR, PROCESSING DISTORTED PULSED SIGNALS

[75] Inventor: Julien Piot, Cambridge, Mass.

[73] Assignee: Willi Studer AG, Regensdorf, Switzerland

[21] Appl. No.: 70,846

[22] Filed: Jul. 6, 1987

[30] Foreign Application Priority Data

Jul. 10, 1986 [CH] Switzerland .................. 02772/86

[51] Int. Cl.$^4$ .................. H03K 5/22; H03K 9/08; G01R 23/02
[52] U.S. Cl. .................. 364/486; 364/481; 328/111; 328/112
[58] Field of Search .................. 364/486, 481, 571.01, 364/571.04, 571.07; 328/111, 112; 375/22

[56] References Cited

U.S. PATENT DOCUMENTS

| 3,062,442 | 11/1962 | Boensel et al. | 364/486 |
| 3,790,881 | 2/1974 | Smith | 328/111 |
| 3,936,740 | 2/1976 | Hogg et al. | 364/486 |
| 3,956,616 | 5/1976 | Knollenberg | 235/92 CC |
| 3,961,271 | 6/1976 | Zlydak et al. | 328/111 |
| 4,162,453 | 7/1979 | Rudolph | 328/111 |
| 4,562,549 | 12/1985 | Tanaka et al. | 364/486 |
| 4,675,597 | 6/1987 | Hernández | 328/111 |

FOREIGN PATENT DOCUMENTS 0869011 9/1981 U.S.S.R. .................. 364/486

OTHER PUBLICATIONS

"Automated Pulse-Width Determination System", R. Moreau, IBM Tech. Discl. Bulletin, vol. 27, No. 8, Jan. 1985, pp. 4695–4696.

Electronics International, vol. 55, No. 5, Mar., 1982 (New York, USA), by Y. Josefsberg, entitled: "Stable and fast PLL switches loop bandwidths".

Instruments and Experimental Techniques, vol. 23, No. 3, part 1, May–Jun. 1980, pp. 650 through 652 (Plenum Publishing Corporation, New York USA) by V. V. Blatov et al, entitled: "Pulse Duration Selector".

IBM Technical Disclosure Bulletin, vol. 9, No. 7, Dec., 1966, pp. 793 through 795 by A. J. Folmar et al, entitled: "Pulse–Width Detection and Comparison".

Primary Examiner—Parshotam S. Lall
Assistant Examiner—V. N. Trans
Attorney, Agent, or Firm—Werner W. Kleeman

[57] ABSTRACT

In order to adaptively determine the original pulse widths of individual pulses of the pulse signal, there are measured the pulse widths of the distorted pulses. A predetermined number of threshold values is preset for such measured pulse widths. The preset threshold values define classes of pulse widths intended to contain pulse widths of pulses which originally had the same pulse widths. The matching between the measured pulse widths and the preset threshold values is improved by means of a statistical evaluation of the measured pulse widths. The apparatus for carrying out the aforementioned method comprises a unit or circuit for measuring the pulse widths of the individual pulses, a unit or circuit for statistically evaluating the measured pulse widths and a unit or circuit for processing the measured pulse widths.

10 Claims, 7 Drawing Sheets

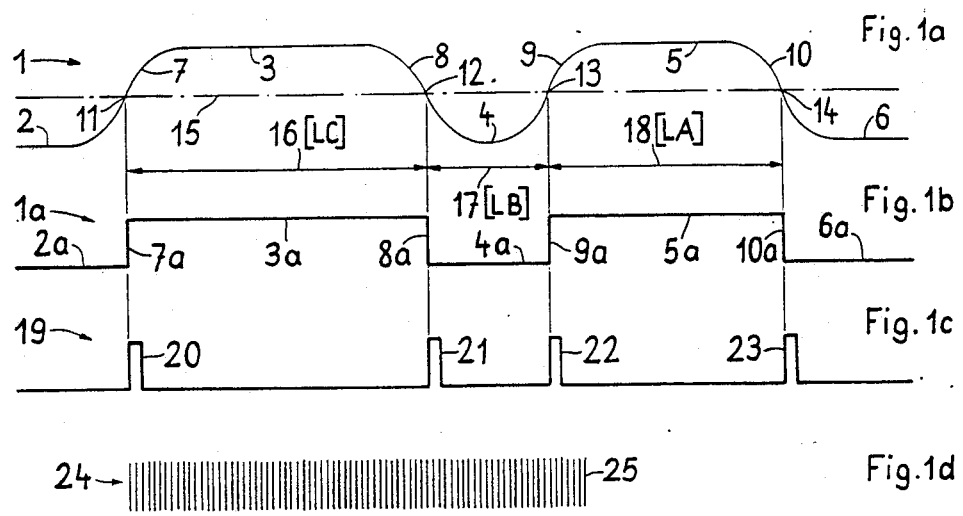
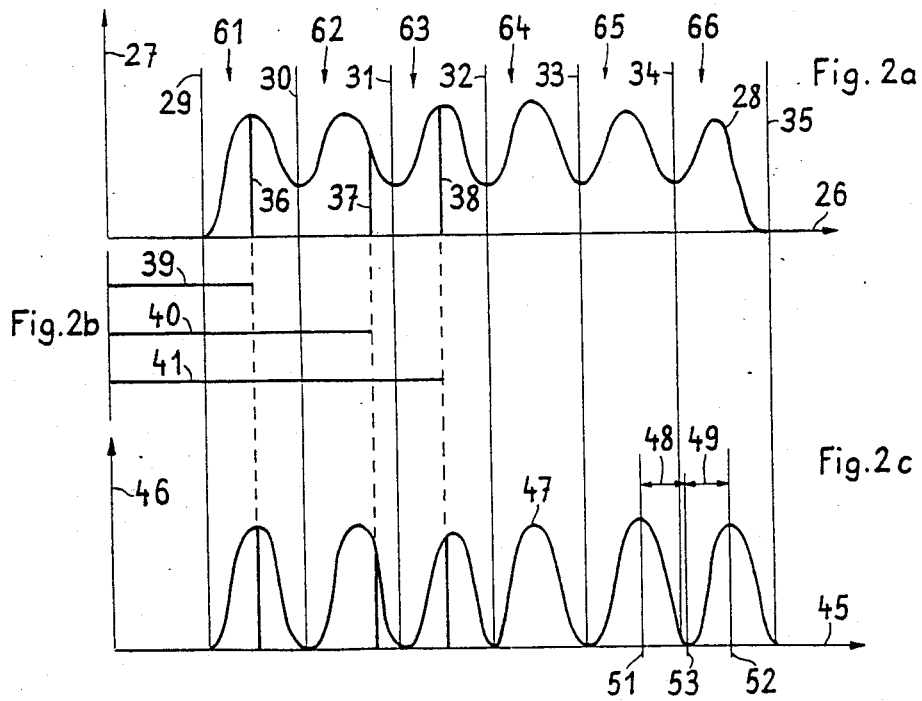

METHOD OF, AND APPARATUS FOR, PROCESSING DISTORTED PULSED SIGNALS

BACKGROUND OF THE INVENTION

The present invention relates to a new and improved method of, and apparatus for, processing a signal containing pulses which have been distorted by a preceding signal transmission or transfer operation undertaken on an original non-distorted pulsed signal.

A method and an apparatus such as known, for example, from European Patent Publication No. 0,148,413 permits correcting faults in signals which are transmitted in the form of pulses, for example, by means of a magnetic record carrier. During the operation of such method and apparatus there are particularly corrected the running lengths or pulse widths or pulse durations of the pulses between successive pulse edges or flanks. For this purpose there are firstly determined the deviations of the signal with respect to the running lengths or pulse widths. Such deviations are stored. Subsequently the input signals are directly processed to produce output signals by combining the stored signal deviations and the input signals, i.e. the running lengths or pulse widths of such input signals. The output signals are formed as a result of such combination.

A circuit for processing, particularly shaping or forming pulses is known, for example, from European Patent Publication No. 0,147,550. Using such circuit or circuit arrangement, deformed pulses or distorted signals can be altered in a manner such as to better correspond to the shape or form which has been originally intended, for example, after recording on a magnetic tape. In this known circuit or circuit arrangement there is detected and measured the temporal spacing between two successive pulses which represent data. This temporal spacing gives an indication of the magnitude of the pulse distortion. A correction signal is generated on the basis of the aforementioned measurement and the incoming pulses are shaped or formed in accordance with such correction signal.

The aforementioned apparatus according to European Patent Publication No. 0,148,413 must be prepared for its operation by loading storage means or memory devices with the signal deviations. Contrary thereto, the last-mentioned circuit or circuit arrangement according to European Patent Publication No. 0,147,550 can be immediately utilized without any particular preparation because this circuit or circuit arrangement is continuously adapted to the incoming signals.

The circuit or circuit arrangement according to European Patent Publication No. 0,147,550 has one disadvantage due to the fact that the input signal constitutes an analog input signal and is processed or altered in analog manner. There is thus attempted to adapt the analog input signal to the ideal and original analog signal. This adapting operation can only succeed to the extent that a more or less amplified correction signal is added to the analog input signal. If such addition is insufficient for achieving the desired correction, the possibilities rendered by such circuit or circuit arrangement are exhausted.

There is one disadvantage of the method and apparatus according to European Patent Publication No. 0,148,413 in that the correction of the determined running lengths or pulse widths is not affected in an adaptive fashion, and as a consequence, the correction is not continuously adapted to the signals being processed.

SUMMARY OF THE INVENTION

Therefore, with the foregoing in mind it is a primary object of the present invention to provide a new and improved method of, and apparatus for, processing a signal containing pulses which have been distorted by a preceding signal transmission or transfer operation undertaken on an original non-distorted pulsed signal, and which method and apparatus are not afflicted with the aforementioned drawbacks and limitations of the prior art heretofore discussed.

Another significant object of the present invention is directed to a new and improved method of, and apparatus for, processing a signal containing pulses which have been distorted by a preceding signal transmission or transfer operation undertaken on an original non-distorted pulsed signal, and real or original running lengths or pulse widths of the pulses which form the signal.

Now in order to implement these and still further objects of the invention, which will become more readily apparent as the description proceeds, the method of the present development is manifested by the features that, the running lengths or pulse widths of the individual pulses are measured, a predetermined number of threshold values is preset for the different running lengths or pulse widths and the measured running lengths or pulse widths are classified in different classes which are bounded by the aforementioned preset threshold values. The classes indicate the original running length or pulse widths of the original non-distorted pulsed signal. The measured running lengths or pulse widths are continuously used for improving the matching or coordination between the measured running lengths or widths and the preset threshold values.

As alluded to above, the invention is not only concerned with the aforementioned method aspects, but also relates to a novel construction of apparatus for carrying out the same. Generally speaking, the inventive apparatus is intended for processing a signal containing pulses which have been distorted by a preceding signal transmission or transfer operation undertaken on an original non-distorted pulsed signal.

To achieve the aforementioned measures, the inventive apparatus, in its more specific aspects, comprises:

A measuring unit or circuit for measuring the running lengths or pulse widths of the pulses;

an evaluation unit or circuit for statistically evaluating the measured running lengths or pulse widths;

a processing unit or circuit for continuously improving the evaluation;

and a processing unit or circuit for processing the measured running lengths or pulse widths.

One of the advantages achieved by the invention can be seen in the fact that, using the inventive method or apparatus, there can be produced signals which are directly suitable for consecutive digital processing. Accordingly, even high-speed components can be utilized in the digital signal processing circuit or unit.

It is a further advantage of the inventive apparatus that such apparatus automatically is adjusted to changed or altered parameters. The information carried by a signal still can be read even if the signal cannot be completely corrected for distortions in an analog manner.

During the processing of pulses which have been distorted due to the preceding recording on a magnetic record carrier, the inventive type of adaptive processing is particularly advantageous because the recording heads and the reproduction heads used in combination with the magnetic record carrier do not have identical characteristics in all cases. Furthermore, even the employed magnetic record carriers may deviate in their characteristics. Also, variations are possible with regard to the tape speed and the recording current. Due to the inventive processing method and apparatus the effects of all such undesired deviations and variations cannot develop their negative effects. This is the case even if such deviations or variations are subject to long-term alterations.

BRIEF DESCRIPTION OF THE DRAWINGS

The invention will be better understood and objects other than those set forth above will become apparent when consideration is given to the following detailed description thereof. Such description makes reference to the annexed drawings, wherein throughout the various figures of the drawings there have been generally used the same reference characters to denote the same or analogous components and wherein:

FIGS. 1a, 1b, 1c, 1d respectively show different types of digital signals which appear in the inventive apparatus;

FIG. 2a is a graph illustrating the frequency distribution of pulse widths appearing in the inventive apparatus and different pulse width classes and their associated threshold values;

FIG. 2b is a graph showing three different pulse widths;

FIG. 2c shows the frequency distribution of pulse widths appearing in the input signal inputted into the inventive apparatus;

DETAILED DESCRIPTION OF THE PREFERRED EMBODIMENTS

Figure 3:
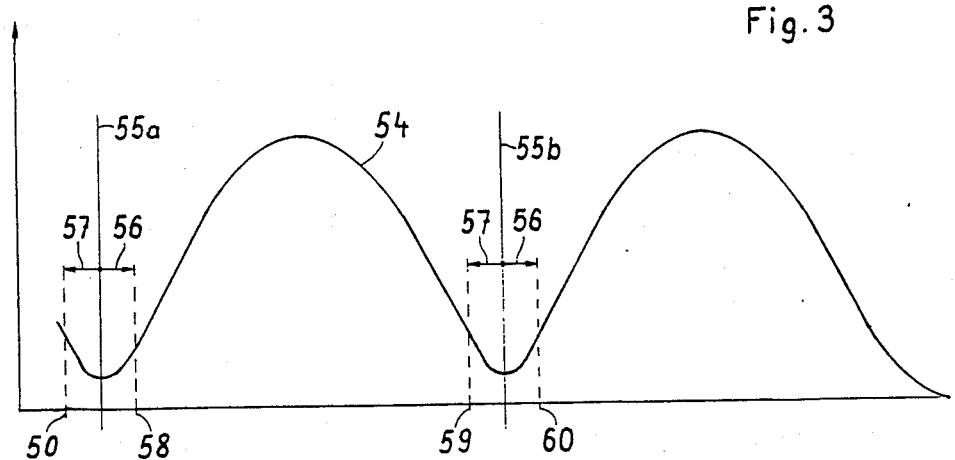
FIG. 3 is a graph showing part of a frequency distribution of pulse widths and specifically illustrates positive and negative spacings from threshold values and which spacings are associated with pulse widths having the same frequency of occurrence.

Describing now the drawings, it is to be understood that only enough of the construction of the inventive apparatus used in the practise of the inventive method, has been shown as needed for those skilled in the art to readily understand the underlying principles and concepts of the present development, while simplifying the showing of the drawings. Turning attention now specifically to FIG. 1 of the drawings, there have been illustrated therein by way of example and not limitation some different types of signals which appear in the inventive apparatus and which is used in connection with carrying out the inventive signal processing method.

Specifically, the signal designated by the reference character 1 constitutes a sequence of positive and negative pulses 2, 3, 4, 5 and 6. The pulses 2 through 6 are delimited or demarcated from each other by respective pulse edges or flanks 7, 8, 9 and 10. The running lengths or pulse widths 16, 17 and 18 of the respective pulses 3, 4 and 5 are defined by respective crossing points 11, 12, 13 and 14 of the respective pulse edges or flanks 7 through 10 and a zero or base line 15.

FIG. 1b illustrates a signal 1a containing pulses 2a, 3a, 4a, 5a and 6a which respectively represent the pulses 2 through 6 of the signal 1 in an ideal shape or form containing associated infinitely steep pulse edges or flanks 7a through 10a.

FIG. 1c illustrates a signal 19 which is only composed of short positive pulses 20, 21, 22 and 23 and each of these pulses indicates the start of a respective running length or pulse width.

FIG. 1d illustrates a clock signal 24 containing pulses 25 and such clock signal 24 can be utilized for measuring, for example, the running lengths or pulse widths 16 through 18 of the pulses 3, 4 and 5 of the signal 1 illustrated in FIG. 1a.

FIG. 2a shows a frequency distribution of measured running lengths or pulse widths. The values of the measured running lengths or pulse widths are plotted along the horizontal axis or abscissa 26. The values of the frequency of occurrence of the various running lengths or pulse widths of a signal and which running lengths or pulse widths have been observed through a relatively long period of time, are plotted along the vertical axis or ordinate 27. The frequency distribution is indicated by the line 28. A predetermined number of preset threshold values for the running lengths or pulse widths are indicated by the vertical lines 29 through 35.

It will be recognized that the frequency of occurrence of the various running lengths or pulse widths is relatively low in the region of the threshold values but substantially higher in the region between the threshold values. The measured frequencies of occurrence of individual running lengths or pulse widths have been indicated at 36, 37 and 38. The predetermined number of preset threshold values 29 through 35 divide the range of possible or occurring running lengths or pulse widths into ranges or classes 61 through 66 of running lengths or pulse widths. Originally or in an ideal case the running lengths or pulse widths which are associated with one of the classes 61 through 66 have the same value.

FIG. 2b illustrates the running lengths or pulse widths 39, 40 and 41 which correspond to the measured frequencies of occurrence 36, 37 and 38 which have been indicated in FIG. 2a.

FIG. 2c also is a graph showing a frequency distribution indicated by the line 47. The measured running lengths or pulse widths are plotted along a horizontal axis or abscissa 45 and the values of the frequency of occurrence of the various running lengths or pulse widths are plotted along a vertical axis or ordinate 46. The frequency distribution which is represented by the line 47 has been measured or plotted under the condition or assumption that each measured running length or pulse width is preceded by a preceding running length or pulse width of the same value, i.e. a pulse having the same running length or pulse width, and followed by a subsequent running length or pulse width having a different value, i.e. a pulse having a different running length or pulse width and which always assumes the same value.

In the frequency distribution illustrated in FIG. 2c, reference numeral 51 designates the running length or pulse width which most frequently occurs between the threshold values 33 and 34. Reference numeral 52 designates the running length or pulse width which most frequently occurs between the threshold values 34 and 35. Reference numeral 53 designates a new or revised threshold value which is derived from the most frequently occurring running lengths or pulse widths 51 and 52. This new or revised threshold value 53 will be seen to have substantially equal spacings 48 and 49 from the most frequently occurring running lengths or pulse widths 51 and 52. On comparison with the frequency distribution 28 illustrated in FIG. 2a, it will be recognized that, due to the altered boundary conditions, nearly no running lengths or pulse widths are measured in the region of the threshold values of the frequency distribution 47.

FIG. 3 also is a graph showing a frequency distribution as represented by a curve 54. In this frequency distribution 54 threshold values 55a and 55b are determined in a manner such that, starting from each one of the threshold values 55a and 55b, there can be provided a positive spacing 56 and a negative spacing 57 which result in respective running lengths or pulse widths 50, 58 and 59, 60 each of which preferably occur at substantially the same frequency.

Figure 4:
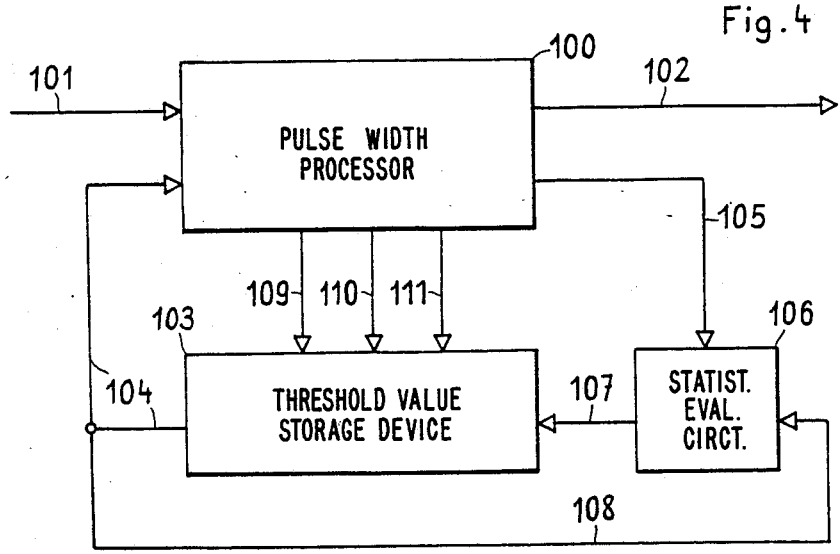
FIG. 4 is a block circuit diagram of a first exemplary embodiment of the inventive apparatus.

FIG. 4 is a block circuit diagram showing a first exemplary embodiment of the inventive apparatus containing a pulse width processor 100 capable of converting, for example, an electrical signal containing pulses which arrive via a line or conductor 101, into a sequence of running lengths or pulse widths. Such running lengths or pulse widths are outputted from the pulse width processor 100 through a bus 102 and appear as a sequence of numbers each of which represents an individual running length or pulse width.

The pulse width processor 100 classifies the incoming pulses in accordance with their running length or pulse width by means of a preset predetermined number of threshold values. Such preset threshold values are stored in a threshold value storage or memory device 103 and can be made available via a bus 104 to the pulse width processor 100 for processing the running lengths or pulse widths of the incoming pulses.

Furthermore, the measured running lengths or pulse widths of the incoming pulses and which running lengths or pulse widths have been classified by means of the preset threshold values, are fed to a statistic evaluation circuit or unit 106 via a bus 105. Such statistic evaluation unit or circuit 106 compiles statistics on the frequency of occurrence of the individual measured running lengths or pulse widths and continuously adapts the preset threshold values stored in the threshold value storage or memory device 103 to the compiled statistics such that new or revised threshold values enable an unequivocal or unambiguous classification of the greatest possible number of measured running lengths or pulse widths. For this purpose, a bus 107 is provided between the threshold value storage or memory device 103 and the statistic evaluation circuit or unit 106.

The outputted threshold values are also infed into the statistic evaluation unit or circuit 106. Buses 109, 110 and 111 are provided for transmitting to the threshold value storage or memory device 103 the running length or pulse width which precedes and that which follows each actually measured running length or pulse width. It is thus permitted to output threshold values for each measured running length or pulse width also as a function of the surrounding running lengths or pulse widths, i.e. the running lengths or pulse widths of the pulses which immediately precede and which immediately follow the pulse associated with the actually measured running length or pulse width.

The mode of operation of the apparatus illustrated in FIG. 4 will be better understood with reference to the Figures described hereinbelow.

Figure 5:
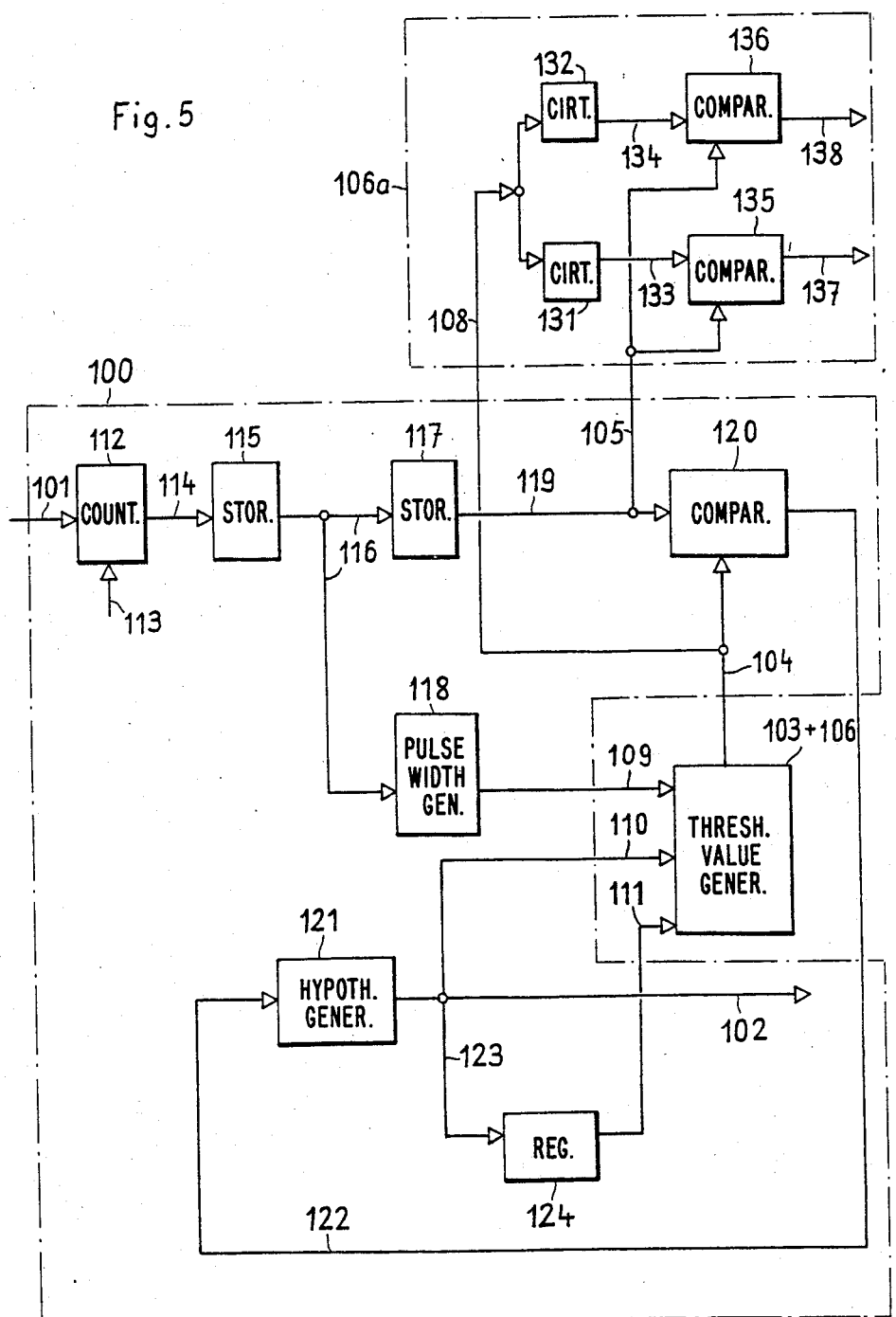
FIG. 5 is a block circuit diagram showing a first detail of the inventive apparatus illustrated in FIG. 4.
Figure 6:
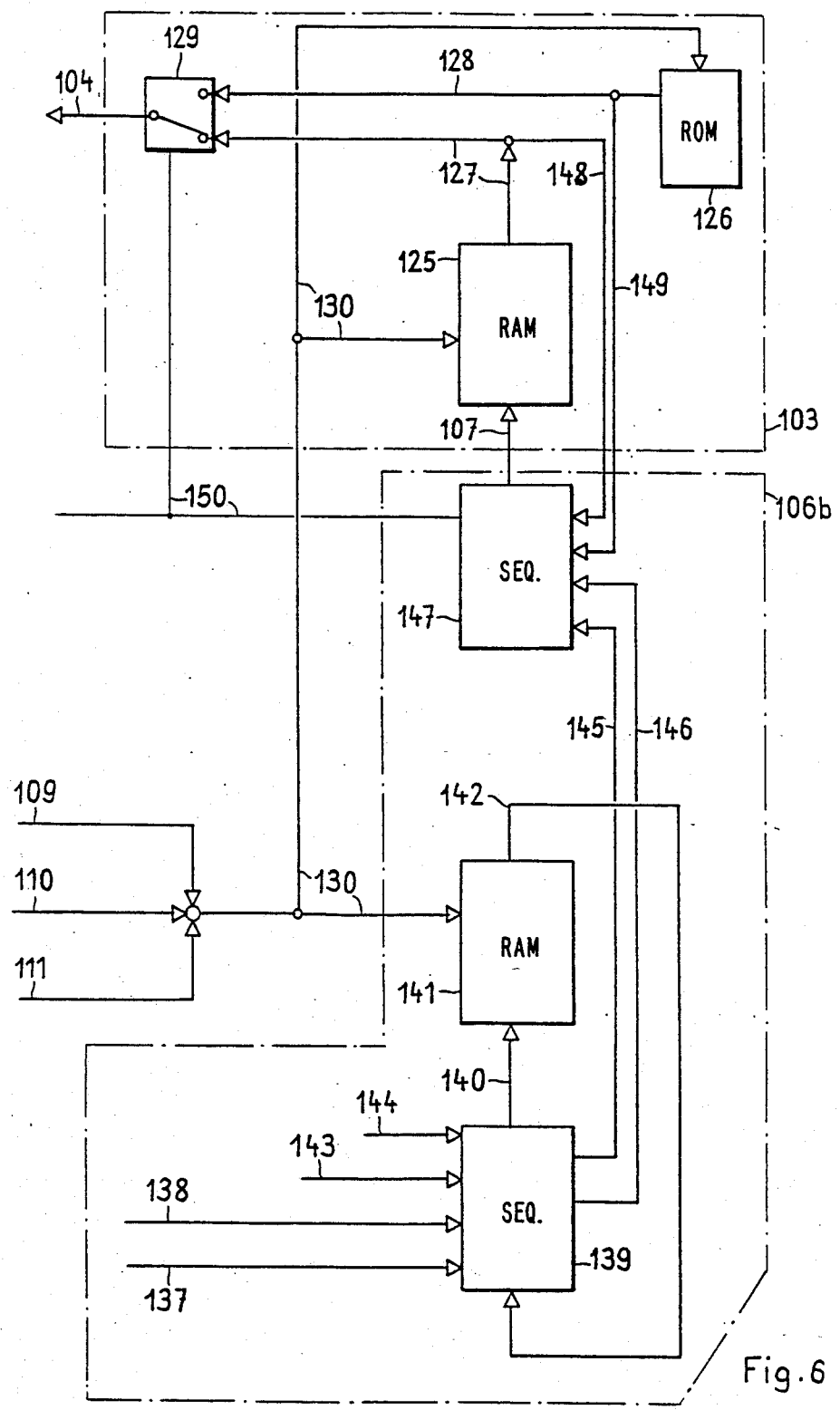
FIG. 6 is a block circuit diagram showing a second detail of the inventive apparatus illustrated in FIG. 4.

FIGS. 5 and 6 are block circuit diagrams respectively showing a first detail and a second detail of the inventive apparatus illustrated in FIG. 4. It should be particularly noted that FIG. 5 shows a threshold value generator designated by the reference character 103+106 and which encompasses the threshold value storage or memory device 103 and the statistic evaluation unit or circuit 106 as shown in FIG. 4. The statistic evaluation unit or circuit 106, in turn, contains two sections 106a and 106b which respectively appear in FIG. 5 and FIG. 6. The illustrations are simplified schematic illustrations in which, for example, conventional means for temporally controlling the different events are not illustrated and which events occur during the operation of the inventive apparatus. However, such temporal control means are readily available to any person reasonably skilled in the art on the basis of the statements made herein-below concerning the temporal sequence of such events.

First of all, there will be defined the terms "threshold value" and "running length or pulse width" and which terms are used in the following description. The running lengths or pulse widths, as already explained hereinbefore with reference to the signal 1 illustrated in FIG. 1a, constitute the spacings or intervals between two successive pulse edges or flanks of a pulse within a signal. In the presently described embodiment, the values of the running lengths or pulse widths assume values between "3" and "9" at a very fine gradation. The running lengths or pulse widths are intended to be classified in terms of classes or ranges of running lengths or pulse widths by means of threshold values.

In the presently described embodiment such threshold values are constituted by the values "3, 4, 5, 6, 7, 8 and 9". The running lengths or pulse widths thus are designated by the smaller one of the two classifying threshold values. Thus, for example, the running lengths or pulse widths which fall into a class defined by the threshold values "4" and "5" are designated as the running length or pulse width "4" etc. This convention is based on the assumption that the processed signal originally or in the ideal case only contains pulses of running lengths or pulse widths having the values "3.5, 4.5, 5.5, 6.5, 7.5, 8.5 and 9.5". Accordingly, the values of the running lengths or pulse widths which are spread around the aforementioned original or ideal values, are now delimited or demarcated relative to each other, for example, in first approximation by threshold values "4, 5, 6, 7, 8 and 9" and, therefore, designated as running lengths or pulse widths "3, 4, 5, 6, 7, 8 and 9".

As illustrated in FIGS. 4 and 5, the signal to be processed arrives via line or conductor 101. Such signal comprises a sequence of pulses of the type as illustrated in FIG. 1a. Such pulses are separated by flanks or edges and blend or merge with each other in the manner substantially as known for digital signals. However, the signal to be processed may also be converted into a signal of the type as illustrated in FIGS. 1b or 1c.

A counter 112 receives a high-frequency clock signal as illustrated in FIG. 1d via a line or conductor 113 and the running length or pulse width of the pulses between their associated flanks or edges is measured using the counter 112 which thus constitutes measuring means for measuring the pulse width of individual pulses. The measured running length or pulse width is supplied to a storage or register 115 via a bus 114. The storage or register 115 stores the measured running length or pulse width until a further running length or pulse width has been counted. The running lengths or pulse widths are now expressed by a number which, for example, is further passed on in parallel together with a seven-bit-word. A bus 116 connects the storage or register 115 with a further storage or register 117 and a pulse width generator 118 which is connected parallel to the further storage or register 117.

In the following, there will be considered the processing of three successive running lengths or pulse widths, namely the running lengths or pulse widths LA, LB and LC which correspond to the respective running lengths or pulse widths 18, 17 and 16 which have been indicated in FIG. 1a. The running length or pulse width LC constitutes the last occurring running length or pulse width and is read into the further storage or register 117 and the pulse width generator 118. The further storage or register 117 delays each read-in running length or pulse width by a delay time period of one running length or pulse width. Therefore, upon the arrival of the running length or pulse width LC at the further storage or register 117, the running length or pulse width LB is read-out from the further storage or register 117 and supplied to a comparator 120 via a bus 119. The pulse width generator 118 which, for example, may constitute a ROM, undertakes a first gross decision. This decision constitutes a comparison of the value of the running length or pulse width LC with the values contained in a table of values which is stored in the pulse width generator 118, and in allocating the running length or pulse width LC to one of the running lengths or pulse widths "3, 4, 5, 6, 7, 8 or 9". This requires a mere three-bit-word which is delivered to a bus 109.

The running length or pulse width LA which was first processed in the pulse width processor 100, at this time is located on the bus 111 and thus is applied to the threshold value generator 103+106. The running length or pulse width LC is also applied to the threshold value generator 103+106 on the bus 109, however, only as an approximate value.

There will now have to be determined the running length or pulse width LB. Since successive running lengths or pulse widths affect each other, a number of sequences of threshold values are stored in the threshold value generator 103+106. Each one of such sequences is intended for a predetermined combination of the running length or pulse widths to be measured and the preceding and following running lengths or pulse widths. In the presently described case, the preceding running length or pulse width LA and the following running length or pulse width LC are known. Therefore, the threshold value generator 103+106 can now determine the sequence of threshold values which is suitable for the running lengths or pulse widths LA, LB and LC. This suitable sequence of threshold values is selected in accordance with the inputted approximate or preliminary value of the running length or pulse width LB which is produced in the manner as described hereinbelow, and is delivered to the comparator 120 via the bus 104. As already explained hereinbefore, the running length or pulse width LB has been applied to the comparator 120 just at this time via the bus 119.

The threshold value generator 103+106 is series connected via a bus 110 with a hypothesis generator 121 which, in turn, is connected with the comparator 120 via a bus 122. By means of the bus 110, the hypothesis generator 121 delivers to the threshold value generator 103+106 assumed preliminary values of the running length or pulse width LB to be determined. This causes the threshold value generator 103+106 to deliver a corresponding threshold value to the comparator 120. The hypothesis generator 121 is constructed, for example, as a sequencer which is activated by each newly arriving actual running length or pulse width and which operates according to the principle of successive approximation. This implies that the hypothesis generator 121 first delivers a mean value, for example, the value "6" for an individual running length or pulse width. Consequently, the threshold value generator 103+106 delivers the threshold value "6" via the bus 104. The comparator 120 determines whether the measured value of the running length or pulse width LB is greater or smaller than "6". This determination is communicated to the hypothesis generator 121 via the bus 122. The hypothesis generator 121, then, makes a further selection. When the comparison had the result that, for example, the new or revised threshold value is smaller than "6", the hypothesis generator 121 selects "4" as the new or further preliminary running length or pulse width. This again causes the threshold value generator 103+106 to deliver, in the manner described hereinbefore, a new or revised threshold value "4" to the comparator 120. If the comparator 120, for example, detects that the running length or pulse width LB is greater than "4", the hypothesis generator 121, then, selects "5" as a further or last threshold value. If the comparator 120, for example, determines that the running length or pulse width LB is smaller than the last threshold value "5", this result is again communicated to the hypothesis generator 121. On the basis of these events the hypothesis generator 121 concludes that the running length or pulse width LB has a value between "4" and "5" and thus is designated "4" in accordance with the aforementioned convention. This value is outputted as a result for further processing via a bus 123 to a register 124 as well as via a bus 102. The register 124 delays the value of the running length or pulse width LB by a time period corresponding to one running length or pulse width and then delivers the value of the running length or pulse width LB to the bus 111. As a result of this operation, the original running length or pulse width LB is converted into a first or oldest running length or pulse width of a group of three pulse widths.

There is thus concluded a first cycle for determining a running length or pulse width. This first cycle is followed by a second cycle during which the adaptation of the threshold values to the precedingly measured running length or pulse width is improved.

The predetermined number of preset threshold values is stored in the threshold value storage or memory device 103, see FIGS. 4 and 6. Essentially the threshold value storage or memory device 103 comprises a RAM-storage means 125 containing continuously adapted threshold values as well as a ROM-storage 126 containing the predetermined number of preset threshold values. The two storage means are connected to a switching element 129 by related buses 127 and 128; the switching element 129 is connected to the bus 104. When the inventive apparatus is set into operation, the predetermined number of preset threshold values is delivered from the storage means 126 to the bus 104 via the bus 128 and to a bus 149. The threshold values on the bus 104 are utilized in the known heretofore described manner whereas the threshold values on the bus 149 are read into the storage means 125 via a sequencer 147. After a predetermined period of time, the storage means 125 are filled and the switching element 129 switches to the position as illustrated in FIG. 6. The running lengths or pulse widths which are applied via the buses 109, 110 and 111, arrive at the storage means 125 and 126 via a bus 130 which respectively enables the storage means 125 and 126 to output the corresponding threshold values via the bus 127 or 128.

The second cycle is started already during the first cycle of the operation by using the detected or associated value of the measured running length or pulse width LB for causing the threshold value generator 103+106 to again read-out via the bus 104 the upper and lower threshold values associated with this measured running length or pulse width LB. If the value "4" has been determined for the running length or pulse width LB, such upper and lower threshold values are constituted by the threshold values "4" and "5". These two threshold values are supplied to units or circuits 131 and 132 via a bus 108, see FIG. 5. The unit or circuit 132 constitutes a decreasing unit or circuit in which the upper threshold value is decreased by one bit, namely by the least significant bit. The unit or circuit 131 constitutes an increasing unit or circuit in which the lower threshold value is increased by one bit, namely the least significant bit. There are thus determined by the units 131 and 132 the running length or pulse width 58 or 59 as illustrated in the frequency distribution shown in FIG. 3.

These increased and decreased upper and lower threshold values are then delivered to respective comparators 135 and 136 by related buses 133 and 134. In such comparators 135 and 136 the increased and decreased lower and upper threshold values are compared to the actually measured value of the running length or pulse width LB which is supplied to the comparators 135 and 136 via bus 105. A signal is outputted via related lines 137 and 138 and supplied to the sequencer 139, see FIG. 6, one of the values 58 or 59 which is present on the related bus 133 and 134, conforms with the actually measured running length or pulse width LB from the bus 105. At this time, the actual but already definitively determined running length or pulse width LB on the bus 110 is present as an address at the storage or memory device 141. As a consequence, the numbers stored in the storage or memory device 141 are delivered to the sequencer 139 via a bus 142. Such numbers, for example, indicate the difference between the numbers of hitherto measured running lengths or pulse widths 50 and 58 or 59 and 60. One of the numbers which is associated with the lower threshold value, is now increased by one unit if a signal is present on the line or conductor 137. The remaining number which is associated with the upper threshold value is decreased by one unit if a signal is present on the line or conductor 138. This means that for forming the aforementioned differences, the running lengths or pulse widths 58 and 60 are counted in the positive whereas the running lengths or pulse widths 50 and 59 are counted in the negative.

In the storage or memory device 141, there are provided for each classified running length or pulse width two such storage locations or one storage location for each threshold value 55a and 55b, see FIG. 3. If excessive counted values accumulate at such storage location after a predetermined period of time which is indicated by a signal on the line or conductor 143, the related threshold value is unfavorably selected and must be displaced. If this operation is concluded or a further value for a running length or pulse width LB is present on the bus 110, the numbers present at the sequencer 139 are returned to the storage or memory device 141 via a bus 140. Preferably, the storage or memory device 141 is constructed as a RAM. If a different running length or pulse width is present on the bus 110, corresponding events occur with respect to different threshold values.

In other words, the storage or memory device 141 conjointly with the sequencer 139 counts the frequency of occurrence of running lengths or pulse widths having a predetermined positive or negative deviation from the presently valid threshold value or located at a predetermined spacing from the presently valid threshold value. If running lengths or pulse widths having positive or negative deviations predominate within a predetermined period of time by a predetermined extent, the related threshold value must be displaced. A signal is communicated to the sequencer 139 via a line or conductor 143 and such signal indicates the start and the time period of a counting operation. By means of a signal on the line or conductor 144 the sequencer 139 is notified at which time such sequencer 139 may deliver signals via lines or conductors 145 and 146 in order to displace a threshold value. The presence of a signal on the line or conductor 145 means that the threshold value must be upwardly displaced or shifted. The presence of a signal on the other line or conductor 146 means that the threshold value must be downwardly displaced or shifted. Such displacement may occur, for example, in unit steps.

The lines or conductors 145 and 146 are connected to a sequencer 147 which is connected to the storage means 125 and 126 via respective buses 148 and 149. The bus 107 additionally interconnects the sequencer 147 and the storage means 125. At each time at which the running length or pulse width LB is present on the bus 130, a corresponding threshold value can arrive at the sequencer 147 via the buses 127 and 148 and may be increased or decreased by a unit value in the sequencer 147. Thereafter, the altered threshold value is returned to the storage means 125 via the bus 107. However, the alteration or displacement of the threshold value is only effected if corresponding signals are present on the lines or conductors 145 or 146.

Furthermore, a control line or conductor 150 is provided for determining the operational state or condition of the switching element 129 and the sequencer 147. In correspondence with such determination of the position of the switching element 129, the sequencer 147 cooperates either with the storage means 125 or the storage means 126.

The exemplary embodiment of the inventive apparatus as described hereinbefore with reference to FIGS. 4 through 6 of the drawings, is particularly suited for processing digital audio signals. Such digital audio signals arrive at a frequency of at least 44 kHz. Thus it is conceivable that certain simplifications can be made in connection with the processing of signals having lower frequencies.

The inventive method as described hereinbefore with reference to the first exemplary embodiment of the inventive apparatus is particularly suited for processing digital signals which are encoded with regard to a running length or pulse width code and which are altered during a transmission or recording, for example, on a magnetic record carrier, in a manner such that there occur running lengths or pulse widths which are spread over a certain range, instead of the original discrete running length or pulse width. The inventive method and apparatus are directed to processing the signals in such a manner that a discrete running length or pulse width can be associated with the running lengths or pulse widths which are spread over the aforementioned range. For this purpose and in a first step of the operation, the running lengths or pulse widths of the pulses are measured and which pulses form the input or incoming signal. Parallel thereto, there are preset a predetermined number of threshold values which are intended to permit classifying the entirety of the occurring running lengths or pulse widths and associate the occurring running lengths or pulse widths with a predetermined number of classes or ranges of running lengths or pulse widths. In accordance with such classification, all running lengths or pulse widths which are associated with an individual class should have had the same running length or pulse width in the original state, i.e. prior to the processing, transmission or recording of the original non-distorted pulsed signal which resulted in the input or incoming signals.

The classes and thus also the threshold values are determined by means of a statistic evaluation of the measured running lengths or widths. Subsequently the threshold values and the measured running lengths or pulse widths are continuously matched to each other such that the current association of the measured running lengths or pulse widths to the aforementioned classes is improved. This can be effected by adapting the threshold values to the measured running lengths or pulse widths which is the case in the method just described. However, this can also be effected by precedingly adapting in an improved manner the running lengths or pulse widths to be measured to the predetermined threshold values. This particular adaptation method will be described hereinbelow with reference to FIGS. 7 through 11.

Figure 7:
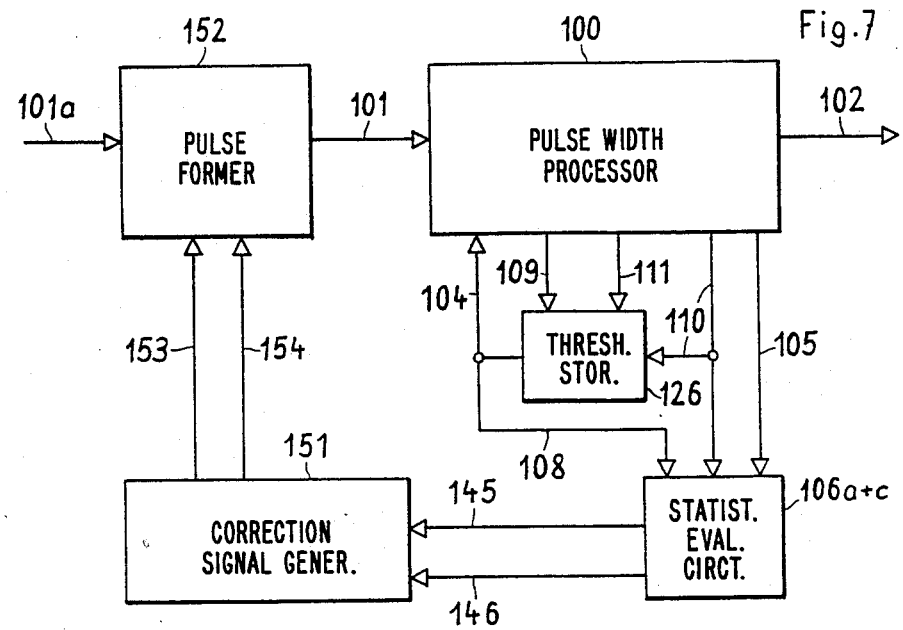
FIG. 7 is a block circuit diagram showing a second exemplary embodiment of the inventive apparatus.

FIG. 7 shows the pulse width processor 100 which has already been described hereinbefore with reference to FIGS. 4 and 5. In the presently described second exemplary embodiment of the inventive apparatus, the pulse width processor 100 is series connected to a pulse former 152. The pulse former 152 receives the pulses of an input signal and which pulses arrive via a line or conductor 101a. The incoming pulses are altered in a manner which will be described hereinbelow and delivers the altered pulses via the line or conductor 101 to the pulse width processor 100. This pulse width processor 100 processes the incoming pulses in the manner which has been described hereinbefore with reference to FIGS. 4 and 5. This pulse width processing operation is effected by means of the threshold values which are stored in the storage means 126. The processed running lengths or pulse widths are outputted via the bus 102.

The pulse width processor 100 is connected to a statistic evaluation unit or circuit 106a+c via buses 105 and 110. The statistic evaluation or circuit 106a+c, in turn, is connected with a correction signal generator 151 by lines or conductors 145 and 146. Lines or conductors 153 and 154 are provided for conducting correction signals from the correction signal generator 151 to the pulse former 152.

Also in this second exemplary embodiment of the inventive apparatus the running lengths or pulse widths of the pulses in the input signal are processed during a first cycle of operation; in a second cycle of operation the correction signals for the pulses of the input signal are adapted to the prevailing conditions.

Figure 8:
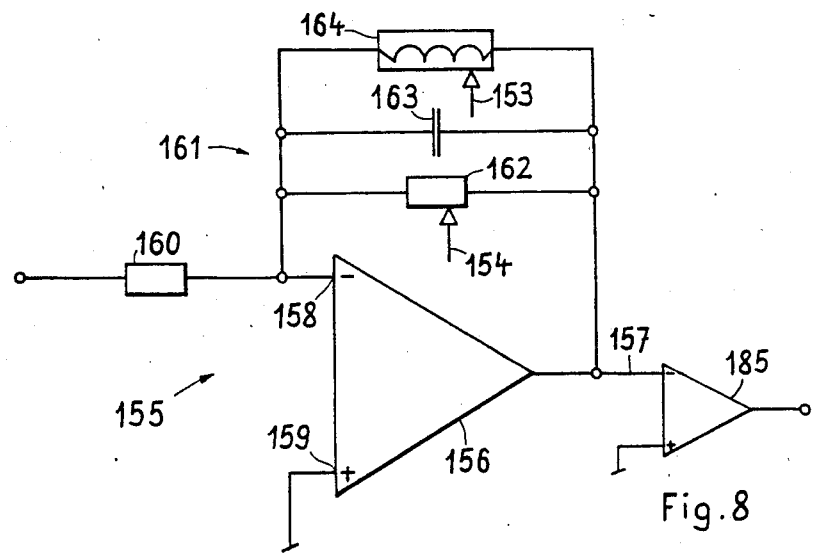
FIG. 8 is a block circuit diagram showing a tuned amplifier of the inventive apparatus illustrated in FIG. 7.

FIG. 8 is a block circuit diagram showing a resonance or tuned amplifier 155 of the type which can be utilized, for example, as the pulse former 152. Specifically, the resonance or tuned amplifier 155 comprises an operational amplifier 156 containing an output 157 and inputs 158 and 159. The inverting input 158 is connected to an input resistor 160. The input 159 is connected to ground. A feedback circuit is provided for the inverting input 158. The feedback circuit 161 contains an adjustable resistor 162, a capacitor 163 and an adjustable inductance 164 all of which are connected parallel to each other. For adjustment the inductance 164 is connected to a line or conductor 153 and the resistor 162 to a line or conductor 154. Preferably, the output 157 is connected to a comparator 185 so that a digital output signal can be picked off the output 157 of the resonance or tuned amplifier 155.

The construction and mode of operation of the pulse width processor 100 corresponds to the construction and mode of operation as described hereinbefore with reference to FIG. 5.

Figure 9:
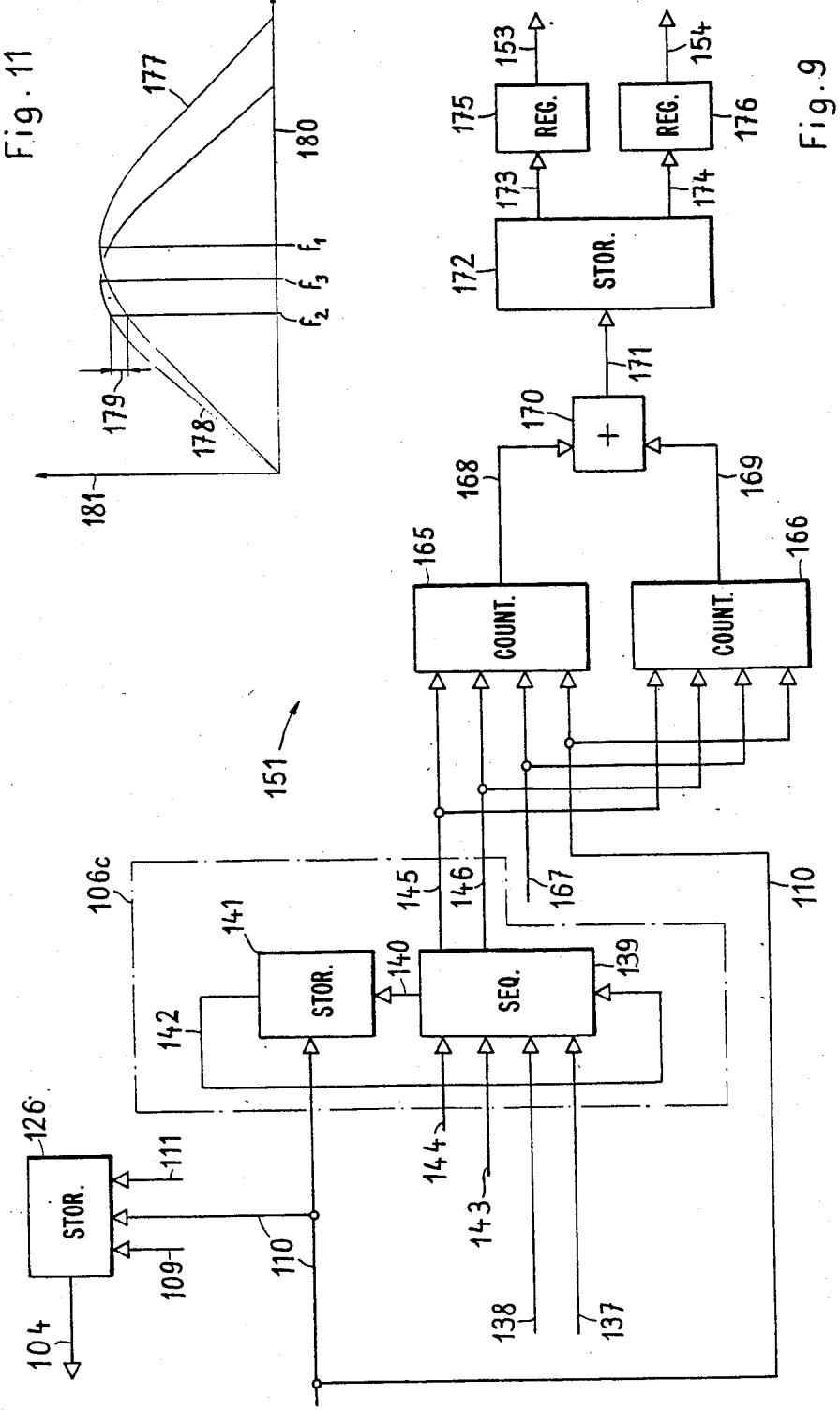
FIG. 9 is a block circuit diagram showing a correction signal generator and its circuit connections in the inventive apparatus illustrated in FIG. 7.

FIG. 9 is a block circuit diagram illustrating the construction of the threshold value generator 103+106 as utilized in the second exemplary embodiment of the inventive apparatus. The actual running length or pulse width LB is supplied to the storage means 126 via the bus 110. Further buses 109 and 111 are provided for also supplying to the storage means 126 the running length or pulse width which precedes the actual running length or pulse width LB and the running length or pulse width which follows the actual running length or pulse width LB. The storage means 126 are thus permitted to deliver a threshold value to the comparator 120 via the bus 104. This operation is repeated until the hypothesis generator 121 delivers a result.

The last threshold value and the following threshold value decreased by one unit and which decreased threshold value is only important for correcting the pulses, are supplied in the aforedescribed manner to the section 106a of the statistic evaluation unit or circuit 106 and processed therein. Correspondingly, the buses 137 and 138 deliver signals to the sequencer 139 which conjointly with the storage or memory device 141 forms the section 106c of the statistic evaluation unit or circuit. There is then determined conjointly by the sequencer 139 and the storage or memory device 141, in the aforedescribed manner, whether the threshold values are correctly or unfavorably situated. In the case of an unfavorable situation of the threshold values, the sequencer 139 delivers a signal via the line or conductor 145 and this signal indicates whether the threshold value must be upwardly or downwardly displaced or shifted. A command is given via the line or conductor 146 and this command determines whether and at which time the displacement of the threshold value is desired.

The aforementioned two signals on the lines or conductors 145 and 146 are supplied to a counter 165 and a counter 166. The two counters 165 and 166 are also connected to the bus 110 and additionally receive a time signal via a line or conductor 167. For reasons of simplicity, only preselected running lengths or pulse widths are considered for judging the situation of the threshold values. Therefore, the counter 165, for example, counts commands for displacing a threshold value and which commands originate from the lines or conductors 145 and 146, only in the event that a running length or pulse width having the value "3" is present on the bus 110. The counter 166 executes the same operation for running lengths or pulse widths having the value "4". However, the two counters 165 and 166 perform the counting operation only as long as the time signal originating from the line or conductor 167 permits such counting operation. Thereafter, this time signal restarts the counters 165 and 166.

The counting values obtained from the counters 165 and 166 are supplied to an adder or addition circuit or unit 170 via lines or conductors 168 and 169 and added in such adder or addition circuit or unit 170. The result of the addition is inputted as an address into a storage or memory device 172 via a line or conductor 171. The storage or memory device 172 contains correction signals which are delivered to registers 175 and 176 via respective lines or conductors 173 and 174. The registers 175 and 176 deliver the correction signals at all times when a counting period has ended. The correction signals, for example, may be previously determined experimentally and then read into the storage or memory device 172.

The correction signals are tapped from the registers 175 and 176 via the respective lines or conductors 153 and 154 and thus enable adjustment of the adjustable resistor 162 and the adjustable inductance 164 in the resonance or tuned amplifier 155. Thus there is altered the shape of the pulses which are present in the input or incoming signal instead of the threshold values which are altered in the previously described first exemplary embodiment of the inventive apparatus for providing an improved match or coordination between the measured running lengths or pulse widths and the threshold values.

Figure 11:
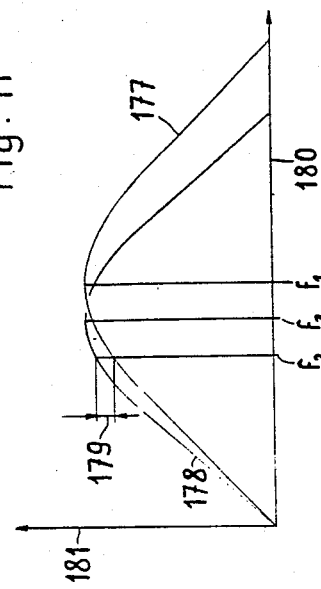
FIG. 11 is a graph showing the frequency response of the tuned amplifier illustrated in FIGS. 8 and 10.

FIG. 11 is a graph showing the frequency response of a resonance or tuned amplifier such as the resonance or tuned amplifier 155. In FIG. 11, the signal frequency is plotted along the horizontal axis or abscissa 180 and the degree of amplification is plotted along the vertical axis or ordinate 181. Depending upon the adjustment of the adjustable resistor 162 and the adjustable inductance 164, there results a frequency response curve 177 having a maximum amplification or gain for signals having the frequency f1. If, for example, a signal only consists of pulses having substantially the same running length or pulse width, the signal frequency is constant. Such constant signal frequency, for example, may have the value f2. The frequency response curve 177 yields a value for the amplification of such constant-frequency signal by the resonance or tuned amplifier 155.

The shape of the pulses as well as the location of the zero crossing of the flanks or edges of these pulses can be altered by changing the amplification for the input signal applied to the resonance or tuned amplifier 155. Such alteration is desired, for example, in order to adapt the input signal and the respective running length or pulse width to the preset threshold values in an improved manner. For thus altering the amplification at a predetermined frequency, the resistance of the adjustable resistor 162 and the inductance of the adjustable inductance 164 are altered in the resonance or tuned amplifier 155. There thus results in FIG. 11, for example, a different frequency response curve 178 which has its maximum amplification or gain at a frequency f3. Regarding the frequency f2, there will thus result a changed amplification which is increased by the amount as indicated by the reference character 179. The change in the amplification thus is effected by the correction signals which are present on the lines or conductors 153 and 154, see also FIG. 9.

Figure 10:
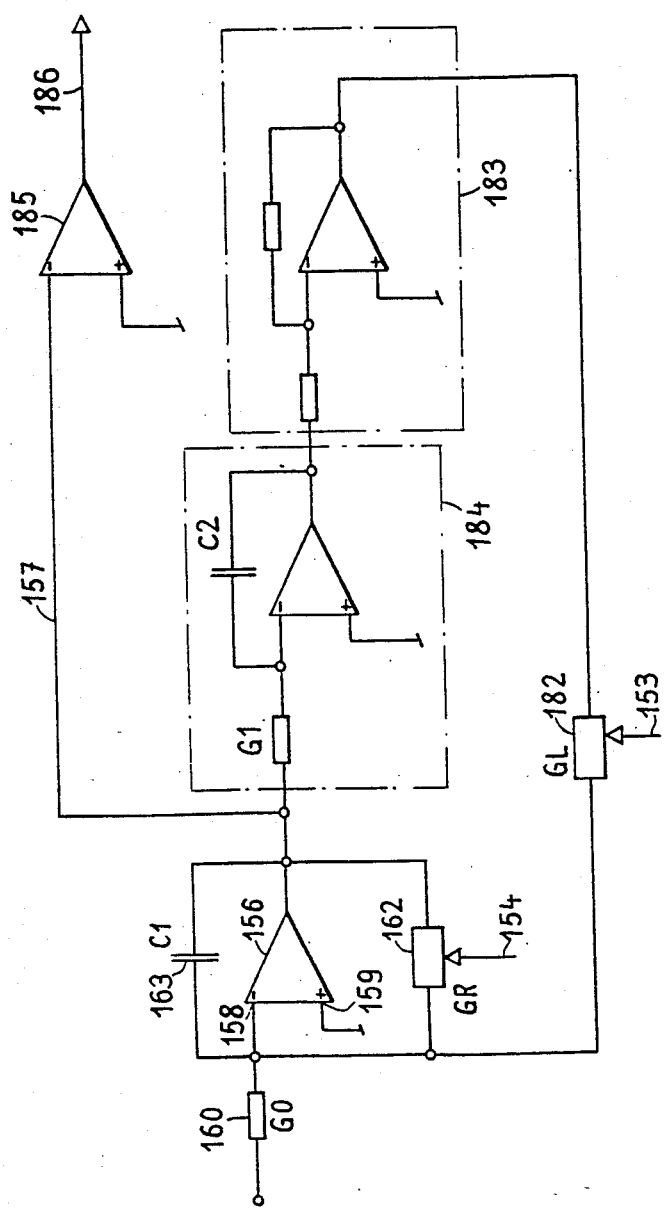
FIG. 10 is a block circuit diagram showing a modified tuned amplifier for use in the inventive apparatus illustrated in FIG. 7.

A modification or further possibility of the construction of a resonance or tuned amplifier is shown by the block diagram of FIG. 10. In comparison to the resonance or tuned amplifier as illustrated in FIG. 8, the adjustable inductance 164 in the feedback circuit has been replaced by a series connection of an adjustable resistor 182, a phase inverter amplifier 183 and an integrator 184 in the modified resonance or tuned amplifier illustrated in FIG. 10. The output 157 still comprises the comparator 185.

In this modified resonance or tuned amplifier the resonance or natural frequency can be altered by readjusting the two adjustable resistors 162 and 182. There can thus be obtained a digital signal at the output 186 of the comparator 185.

The modified resonance or tuned amplifier illustrated in FIG. 10 is characterized by a Laplace transfer function $A(p)$ as follows:

$$A(p) = \frac{[(G0 \cdot C2)/(G2 \cdot G1)] \cdot p}{1 + p\left[\dfrac{GR\ C2}{G1\ G2}\right] + p^2\left[\dfrac{C1\ C2}{G2\ G1}\right]}$$

The quality factor Q $$Q = \frac{1}{GR}\sqrt{\frac{C1 \cdot G1 \cdot G2}{C2}} = \text{constant}$$

The variable frequency is $$\text{The variable frequency is } f = \frac{1}{2\pi}\sqrt{GL}\sqrt{\frac{G1}{C1\ C2}}$$

wherein p is the Laplace operator and the G-values constitute values of conductances.

While there are shown and described present preferred embodiments of the invention, it is to be distinctly understood that the invention is not limited thereto, but may be otherwise variously embodied and practiced within the scope of the following claims. Accordingly,

What I claim is:

1. A method of processing a signal containing pulses which have been distorted by a preceding signal transfer operation on an original non-distorted pulsed signal, said method comprising the steps of:

measuring the pulse width of individual ones of the pulses;

presetting a predeterminate number of threshold values associated with predetermined values of the pulse width of the individual pulses;

classifying the measured pulse widths of the individual pulses in different classes defined by said predeterminate number of threshold values such that each one of said classes is associated with and indicative of an associated pulse width appearing in the original non-distorted pulsed signal; and during said step of classifying said measured pulse widths, continuously comparing the measured pulse widths of the individual pulses and associated ones of said predeterminate number of threshold values and selectively varying either one of (i) said associated preset threshold values or (ii) the pulse widths of said individual pulses for improving the match between said measured pulse widths and said predeterminate number of threshold values.

2. The method as defined in claim 1, wherein:

said step of classifying the measured pulse widths of the individual pulses in different classes defined by said predeterminate number of threshold values entails bounding each one of said different classes by two consecutive ones of said predeterminate number of threshold values;

said step of measuring the pulse width of the individual pulses entailing the step of measuring the pulse widths of individual pulses associated with two of said different classes; and said step of improving the coordination between said measured pulse width and said predeterminate number of threshold values entailing the step of periodically replacing said preset threshold values with revised threshold values based on said measured pulse width associated with said two different classes.

3. The method as defined in claim 2, further including the step of:

determining each one of said revised threshold values as a threshold value relative to which pulse widths of substantially equal frequency of occurrence appear at predetermined spacings from such revised threshold value in a direction to greater pulse widths as well as in a direction to smaller pulse widths.

4. The method as defined in claim 1, further including the steps of:

determining the original pulse width as a variable pulse width of a predetermined one of said individual pulses; and during said step of determining said original pulse width, maintaining constant the pulse widths of pulses adjacent to said predetermined individual pulse.

5. The method as defined in claim 1, wherein:

said step of improving the coordination between said measured pulse widths and said predeterminate number of threshold values entails determining the frequency of occurrence of predetermined measured pulse widths within at least one of said different classes defined by said predeterminate number of threshold values.

6. The method as defined in claim 1, wherein:

said step of improving the coordination between said measured pulse widths and said predeterminate number of threshold values entails the step of counting the frequency of occurrence of predetermined measured pulse widths on both sides of a predetermined threshold value and constituting a side of smaller pulse widths as well as a side of greater pulse widths in relation to said predetermined threshold value;

generating correction signals for changing the individual pulses and their pulse widths on the basis of said counted frequency of occurrence of predetermined measured pulse widths; and altering said individual pulses and their pulse widths by means of said correction signals.

7. The method as defined in claim 1, wherein:

said step of classifying the measured pulse widths of the individual pulses into different classes defined by said predeterminate number of threshold values entails determining for each one of said different classes the pulse width which is measured at the highest frequency of occurrence; and utilizing the most frequently occurring pulse widths of two consecutive ones of said different classes, which are bounded by three associated ones of said preset threshold values, for determining revised ones of said three associated preset threshold values.

8. An apparatus for processing a signal containing pulses which have been distorted by a preceding signal transfer operation undertaken on an original non-distorted pulsed signal, comprising:

a pulse width processor for processing the signals containing the individual pulses;

said pulse width processor containing measuring means for measuring the pulse widths of the individual pulses;

statistical evaluating means connected with an output side of said measuring means in said pulse width processor;

said statistical evaluating means classifying the measured pulse widths in accordance with a predeterminate number of pulse width classes bounded by respective threshold values;

said statistical evaluating means containing comparator means for comparing the measured pulse widths and associated ones of said threshold values; and said statistical evaluating means further containing circuit means connected to said comparator means for selectively varying either one of (i) said associated threshold values or (ii) said measured pulse widths for continuously improving the match between the measured pulse widths and said predeterminate number of pulse width classes.

9. The apparatus as defined in claim 8, further including:

threshold value storage means having an output side connected to said pulse width processor;

said threshold value storage means having an input side connected to said statistical evaluating means;

said threshold value storage means storing a predeterminate number of threshold values defining said predeterminate number of pulse width classes; and said circuit means of said statistical evaluating means varying said associated threshold values for continuously improving the match between said measured pulse widths and said predeterminate number of threshold values and supplying improved threshold values to said threshold value storage means.

10. The apparatus as defined in claim 8, wherein:
said circuit means of the statistical evaluating means contain a pulse former;
said measuring means for measuring the pulse widths of the individual pulses being series connected with said pulse former;
said circuit means of the statistical evaluating means further containing correction signal generating means operatively interconnecting said statistical evaluating means and said pulse former; and
said correction signal generator generating control signals for controlling the operation of said pulse former.

* * * * *